(12) United States Patent
Tanaka et al.

(10) Patent No.: US 7,294,878 B2
(45) Date of Patent: Nov. 13, 2007

(54) SEMICONDUCTOR MEMORY DEVICE AND METHOD OF MANUFACTURING THE SAME

(75) Inventors: Masayuki Tanaka, Yokohama (JP); Yoshio Ozawa, Yokohama (JP); Hirokazu Ishida, Yokohama (JP); Katsuaki Natori, Yokohama (JP); Seiji Inumiya, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 11/088,947

(22) Filed: Mar. 25, 2005

(65) Prior Publication Data
US 2005/0212036 A1    Sep. 29, 2005

(30) Foreign Application Priority Data
Mar. 26, 2004   (JP)   ............... 2004-092535
Feb. 3, 2005    (JP)   ............... 2005-027847

(51) Int. Cl.
*H01L 27/108*   (2006.01)
(52) U.S. Cl. .............. 257/296; 257/316; 257/388; 257/301; 257/302; 438/585; 438/261
(58) Field of Classification Search ................ 257/316, 257/388; 438/261, 585
See application file for complete search history.

(56) References Cited

U.S. PATENT DOCUMENTS

| | | | | |
|---|---|---|---|---|
| 5,631,179 A | * | 5/1997 | Sung et al. ............... 438/264 |
| 5,650,648 A | * | 7/1997 | Kapoor ..................... 257/316 |
| 6,020,238 A | * | 2/2000 | He et al. .................. 438/261 |
| 6,144,054 A | * | 11/2000 | Agahi et al. ............... 257/296 |
| 6,734,484 B2 | * | 5/2004 | Wu .......................... 257/301 |
| 6,800,911 B2 | * | 10/2004 | Miura ....................... 257/412 |
| 2003/0157769 A1 | * | 8/2003 | Weimer .................... 438/261 |
| 2005/0002231 A1 | | 1/2005 | Ozawa et al. |
| 2005/0003619 A1 | | 1/2005 | Tanaka et al. |
| 2005/0212036 A1 | | 9/2005 | Tanaka et al. |

FOREIGN PATENT DOCUMENTS

| | | |
|---|---|---|
| JP | 2001-210734 | 8/2001 |
| JP | 2001-217329 | 8/2001 |
| JP | 2001-223282 | 8/2001 |

OTHER PUBLICATIONS

U.S. Appl. No. 11/344,074, filed Feb. 1, 2006, Tanaka et al.

* cited by examiner

*Primary Examiner*—Mary Wilczewski
*Assistant Examiner*—Tsz K. Chiu
(74) *Attorney, Agent, or Firm*—Oblon, Spivak, McClelland, Maier & Neustadt, P.C.

(57) ABSTRACT

A semiconductor memory device includes a semiconductor substrate, an isolation insulation film filled in a plurality of trenches formed in the semiconductor substrate to define a plurality of element formation regions, a floating gate provided on each of the element formation regions through a first gate insulation film, a control gate provided on the floating gate through a second gate insulation film, and source/drain regions provided in the semiconductor substrate, wherein a mutual diffusion layer is provided at least at an interface between the second gate insulation film and the control gate.

8 Claims, 15 Drawing Sheets

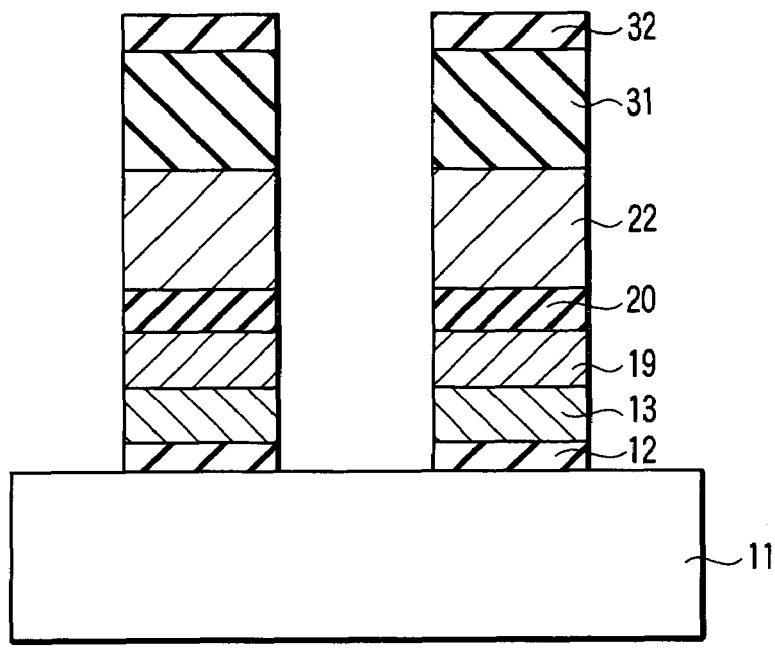
F I G. 9
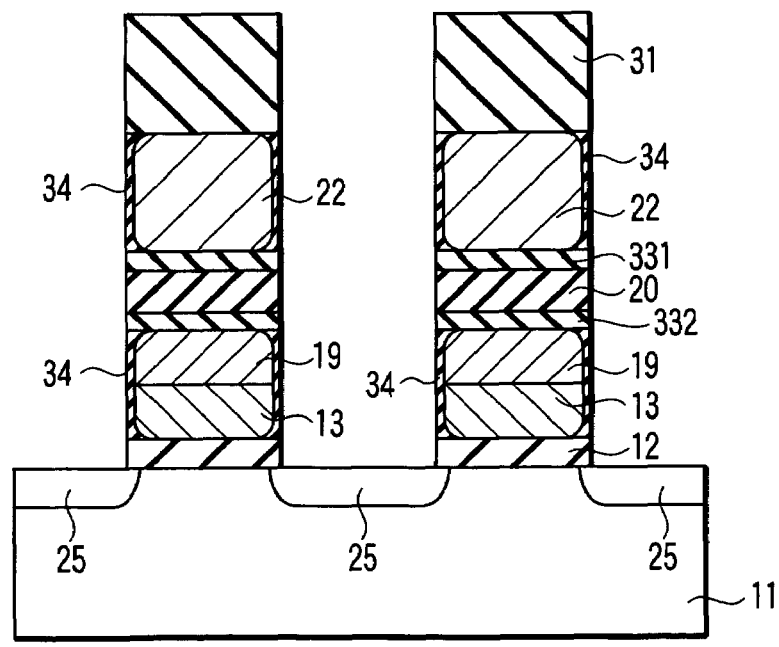
F I G. 10

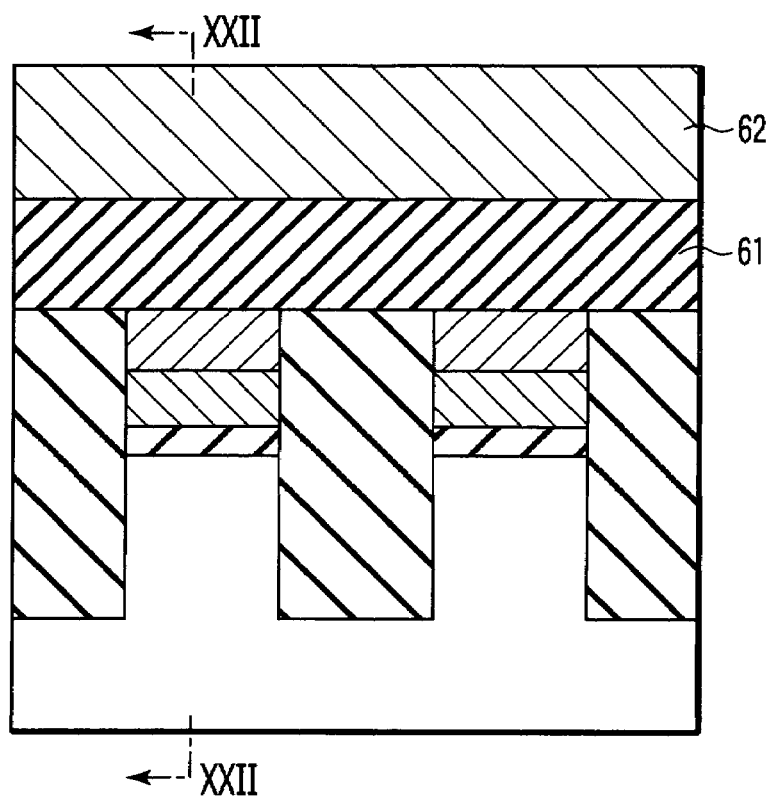
F I G. 21
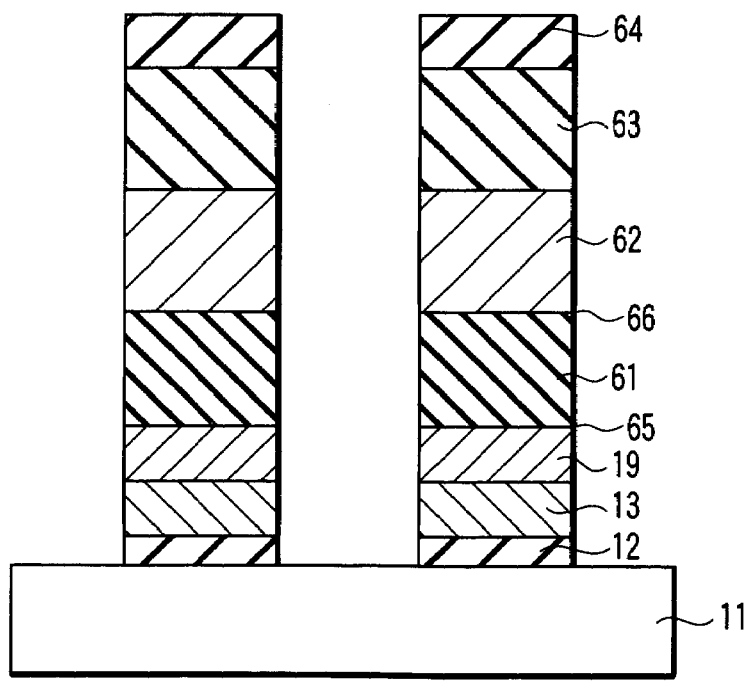
F I G. 22

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Applications No. 2004-092535, filed Mar. 26, 2004; and No. 2005-027847, filed Feb. 3, 2005, the entire contents of both of which are incorporated herein by reference.

BACKGROUND OF THE INVENTION

1. Field of the Invention

The present invention relates to a semiconductor memory device in which an insulation film having a high dielectric constant is formed as an insulation film between electrodes.

2. Description of the Related Art

In a next-generation nonvolatile semiconductor memory device, a distance among cells is shrinked. Consequently, as regards an insulation film between electrodes that is formed between a charge storage layer and a control electrode, the inter-cell distance is made less than in the prior art. As a result, in a three-dimensional structure that is adopted in, e.g. an ONO film (three-layer film of silicon oxide film/silicon nitride film/silicon oxide film), interference between adjacent cells increases conspicuously. This leads to degradation in device characteristics, and it becomes difficult to achieve an increase in area using the three-dimensional structure.

In order to realize the next-generation semiconductor memory device, it is necessary to use, as the inter-electrode insulation film, an insulation film having a higher dielectric constant than in the prior art. The use of the high dielectric constant film can increase the capacity without increasing the area. This makes it unnecessary to use the three-dimensional structure, and the fabrication process is simplified. As a result, the device performance can be enhanced, the manufacturing method can be simplified, and the fabrication steps with a high yield can also be realized.

Jpn. Pat. Appln. KOKAI Publication No. 2001-223282 discloses a nonvolatile memory device using $(TaO)_{1-x}(TiO)_xN(0.01 \leq x \leq 0.09)$ as a high dielectric constant film. This technique is directed to improve the problem of leak current and to enhance the mechanical and electrical strength of the film. Jpn. Pat. Appln. KOKAI Publication No. 2001-210734 discloses that a TaON film is used as an inter-electrode insulation film, thereby obtaining a high electrostatic capacitance.

BRIEF SUMMARY OF THE INVENTION

According to a first aspect of the present invention, there is provided a semiconductor memory device comprising: a semiconductor substrate; an isolation insulation film filled in a plurality of trenches formed in the semiconductor substrate to define a plurality of element formation regions; a floating gate provided on each of the element formation regions through a first gate insulation film; a control gate provided on the floating gate through a second gate insulation film; and source/drain regions provided in the semiconductor substrate, wherein a mutual diffusion layer is provided at least at an interface between the second gate insulation film and the control gate.

According to a second aspect of the present invention, there is provided a semiconductor memory device comprising: a semiconductor substrate;

an isolation insulation film filled in a plurality of trenches formed in the semiconductor substrate to define a plurality of element formation regions;
a floating gate provided on each of the element formation regions through a first insulation film;
a control gate provided on the floating gate through a second insulation film; and
source/drain regions provided in the semiconductor substrate,
wherein the second insulation film has a high dielectric constant and contains silicon.

According to a third aspect of the present invention, there is provided a semiconductor memory device comprising: a semiconductor substrate;
an isolation insulation film filled in a plurality of trenches formed in the semiconductor substrate to define a plurality of element formation regions;
a floating gate of polysilicon provided on each of the element formation regions through a first insulation film;
a second insulation film, provided on the floating gate, containing a metal element;
a control gate of polysilicon, provided on the second insulation film; and
source/drain regions provided in the semiconductor. substrate,
wherein both a polysilicon conductive layer containing a metal element and a mutual diffusion layer composed of a silicate layer of a mixed oxide material composed of a silicon element contained in the control gate and a metal element contained in the second insulation film are provided on a surface of each of the floating gate and the control gate, respectively.

According to a fourth aspect of the present invention, there is provided a semiconductor memory device comprising: a semiconductor substrate;
an isolation insulation film filled in a plurality of trenches formed in the semiconductor substrate to define a plurality of element formation regions;
a floating gate provided on each of the element formation regions through a first insulation film;
a second insulation film provided on the floating gate, the second insulation film having a high dielectric constant and containing carbon;
a control gate provided on the second insulation film; and
source/drain regions provided in the semiconductor substrate.

According to a fifth aspect of the present invention, there is provided a NAND-type flash memory including a plurality of NAND cell units each having a plurality of series-connected memory cells and select transistors arranged at both ends of the memory cells,
each of the memory cells comprising: a plurality of isolation insulation films filled in a plurality of trenches formed in a semiconductor substrate to define a plurality of element formation regions;
a floating gate provided on each of the element formation regions through a first gate insulation film;
a control gate provided on the floating gate through a second gate insulation film;
a mutual diffusion layer provided at an interface between the second gate insulation film and the control gate; and
source/drain regions provided in the semiconductor substrate.

According to a sixth aspect of the present invention, there is provided a method of manufacturing a semiconductor memory device comprising:

forming a first insulation film on a semiconductor substrate;

forming a first conductive layer on the first insulation film;

forming a second insulation film containing a metal element on the first conductive layer;

forming a second conductive layer containing a silicon element on the second insulation film;

annealing the semiconductor substrate to form a mutual diffusion layer at an interface between the second insulation film and the second conductive layer; and successively performing etching down to a surface of the semiconductor substrate to provide a plurality of memory cells.

BRIEF DESCRIPTION OF THE SEVERAL VIEWS OF THE DRAWING

FIGS. 8-10 are cross-sectional views each of which schematically illustrates a part of a fabrication process of a nonvolatile semiconductor memory device according to a second embodiment;

FIGS. 19-22 are cross-sectional views each of which schematically illustrates a part of a fabrication process of a nonvolatile semiconductor memory device according to a fifth embodiment;

DETAILED DESCRIPTION OF THE INVENTION

A film quality of an insulating film having a high dielectric constant, just after film formation, is poor. Therefore, in order to improve the film quality, the high dielectric constant film needs to be subjected to a post-deposition anneal (PDA). Inventors have found in the post-deposition anneal that an increase in density needs to be achieved and that the post-deposition anneal is preferably performed at a higher temperature above the crystallization temperature.

In the PDA just after film formation, however, a problem due to the crystallization arises. If the crystallized high dielectric constant film is used, good adhesion between the crystallized high dielectric constant film and polysilicon, which is an upper electrode, is not achieved. In particular, peeling of the film becomes conspicuous. Furthermore, the crystallization results in formation of grain boundaries. The etching rate of dry etching or chemical etching using a chemical is different between the grain boundary and the crystallized portion, resulting in non-uniformity in shape such as roughness of the substrate or unwanted recessed area in the substrate. Although the high-temperature PDA is indispensable for film modification, these problems arise since it is performed immediately after film formation.

In any case, the PDA that is performed immediately after formation of the high dielectric constant insulation film causes problems due to crystallization. In short, if the crystallized high dielectric constant film is used, the adhesion with the polysilicon that is the upper electrode will deteriorate and, in particular, peeling of the film will become conspicuous. Furthermore, non-uniformity in shape such as roughness of the substrate or recessed area of the substrate will occur.

FIRST EMBODIMENT

Figure 1:
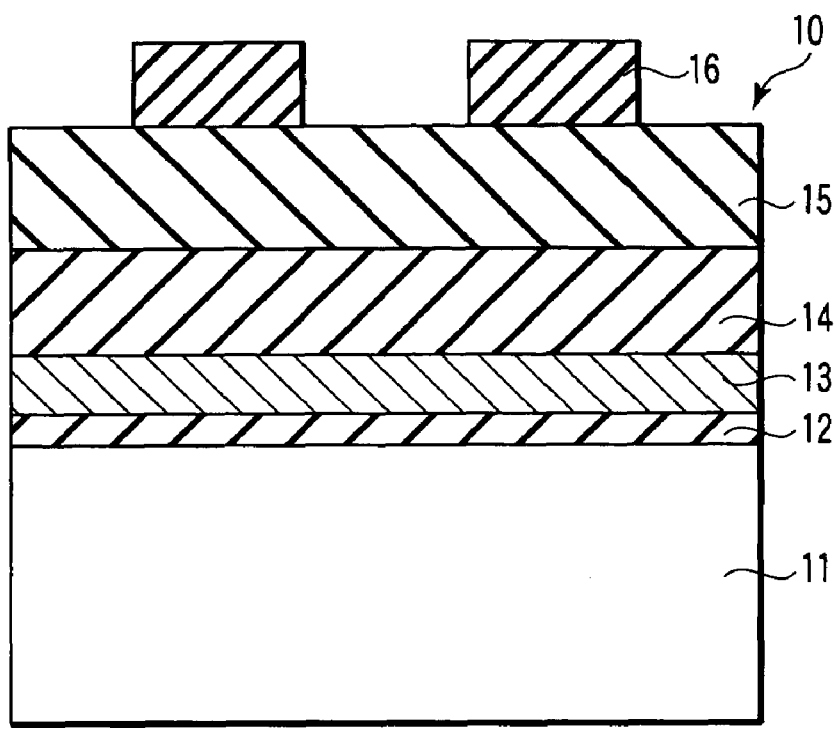
FIGS. 1-6 are cross-sectional views each of which schematically illustrates a part of a fabrication process of a nonvolatile semiconductor memory device according to a first embodiment.

Now referring to FIGS. 1 to 7, a structure of a nonvolatile semiconductor memory device 10 according to a first embodiment will be described along with a manufacturing method thereof. As is shown in FIG. 1, a first insulation film 12 (tunneling insulation film) is formed to a thickness of about 1 to 15 nm on a p-type silicon substrate 11 (or on a p-type well region provided in an n-type silicon substrate), and a first conductive layer 13 of, e.g. polysilicon, which becomes a floating gate and a charge storage layer, is formed on the first insulation film 12 by CVD to a thickness of about 10 to 200 nm.

Then, a silicon nitride film 14 is deposited to a thickness of about 50 to 200 nm on the first conductive layer 13 by CVD. A silicon oxide film 15 is formed to a thickness of about 50 to 400 nm on the silicon nitride film 14, and is coated with a photoresist material, which is patterned to form a resist mask 16.

Figure 2:
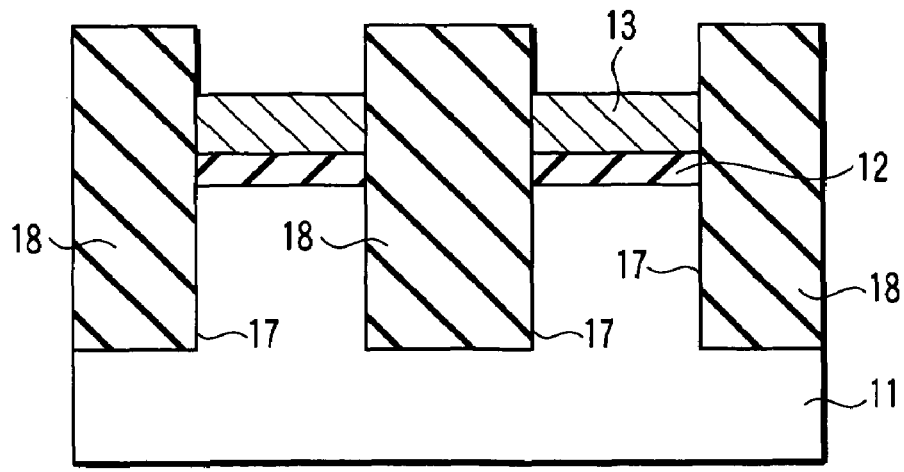

Using the resist mask 16, the silicon oxide film 15 is selectively etched as shown in FIG. 2. After the etching, the resist mask 16 is removed. Then, using the silicon oxide film 15 as a mask, the silicon nitride film 14 is etched, following which the first conductive layer 13, the first insulation film 12, and the silicon substrate 11 are etched to provide isolation trenches 17. After the etching, a high-temperature post-oxidation process is carried out to eliminate damages on the cross-sectional surfaces formed by the etching.

Then, an insulation film 18 such as a silicon oxide film is filled in each of the isolation trenches 17 to a thickness of 200 to 1500 nm, and is subjected to high-temperature heat treatment in a nitrogen atmosphere or an oxygen atmosphere, thereby enhancing the density thereof. Using the silicon nitride film 14 as a stopper, the surface of the resultant structure is planarized by CMP (Chemical Mechanical Polishing). The silicon nitride film 14 is then removed using a hot phosphoric acid that is etchable with a selectivity ratio relative to the silicon oxide film. Thereby, a cross-sectional structure as shown in FIG. 2 is obtained.

In this embodiment, when the isolation trenches 17 are formed, a film stack of the silicon nitride film 14 and the silicon oxide film 15 is used as a mask. Alternatively, a single-layer silicon nitride film, a single-layer silicon oxide film, or any other single-layer/multi-layer film may be used in practice if the film thickness and the reactive ion etching condition are properly set and the film to be used can have a selectivity ration relative to silicon.

Figure 3:
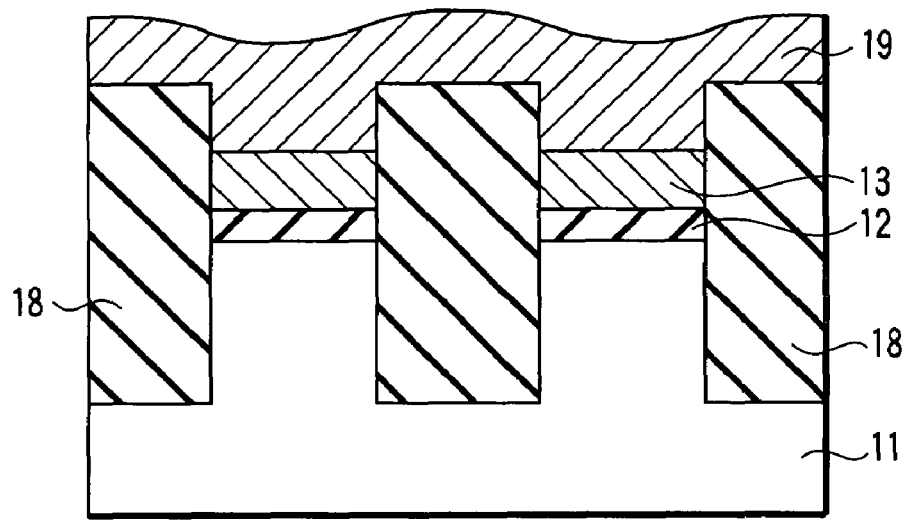

As is shown in FIG. 3, a second-layered conductive layer 19 of polysilicon, which becomes a part of the first conductive layer 13, is deposited over trenches defined after the removal of the silicon nitride film 14 using a method with an excellent step coverage. Then, with use of the buried insulation film 18 as a stopper, the conductive layer 19 is planarized by CMP.

Figure 4:
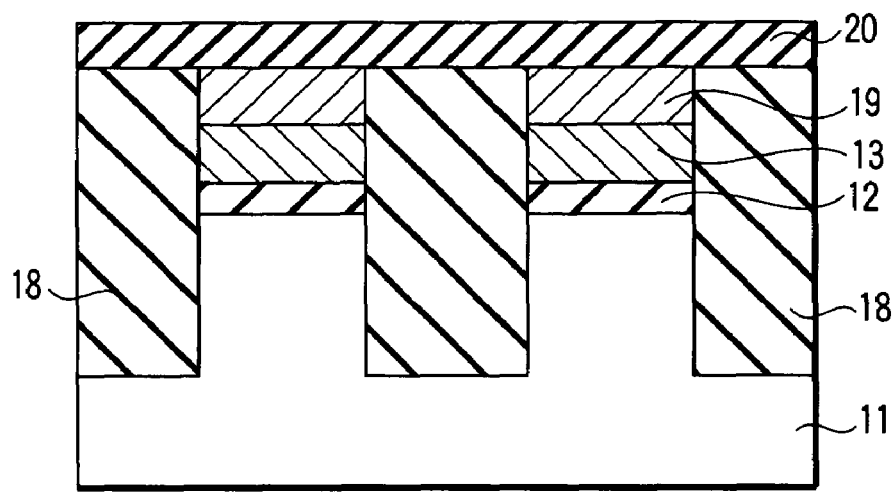

As is shown in FIG. 4, over the planarized conductive layer 19, a second insulation film 20, which has a higher dielectric constant than a silicon oxide film, is formed to a thickness of about 1 to 40 nm.

It is desirable that the high dielectric constant film used as the second insulation film 20 is a film having a dielectric constant that is higher than a specific dielectric constant of 3.8 to 4 of a silicon oxide film ($SiO_2$ film) and, in particular, higher than a specific dielectric constant of about 5 to 5.5 obtained with conventional ONO films.

A single-layer film, or a film stack of a plurality of films, which are selectable from the following examples, may be used as the second insulation film 20: a strontium oxide (SrO) film with a specific dielectric constant of about 6; a silicon nitride ($Si_3N_4$) film with a specific dielectric constant of about 7; an aluminum oxide ($Al_2O_3$) film with a specific dielectric constant of about 8; a magnesium oxide (MgO) film with a specific dielectric constant of about 10; a scandium oxide ($Sc_2O_3$) film or a gadolinium oxide ($Gd_2O_3$) film with a specific dielectric constant of about 14; a yttrium oxide($Y_2O_3$) film or a samarium oxide ($Sm_2O_3$) film with a specific dielectric constant of about 16; a hafnium oxide ($HfO_2$) film or a zirconium oxide ($ZrO_2$) with a specific dielectric constant of about 22; a tantalum oxide ($Ta_2O_5$) film with a specific dielectric constant of about 25; a barium oxide (BaO) film with a specific dielectric constant of about 35; and a bismuth oxide ($Bi_2O_3$) film with a specific dielectric constant of about 40.

Furthermore, a composite film composed of the above films and a silicon oxide film is usable. The composite film may be a film stack of three or more layers. It is desirable, however, that the specific dielectric constant of the entire film is greater than about 5 to 5.5.

Alternatively, an insulation film of a ternary compound such as hafnium aluminate (HfAlO) film may be used. Specifically, an oxide or a nitride, which includes at least one of strontium (Sr), aluminum (Al), magnesium (Mg), scandium (Sc), gadolinium (Gd), yttrium (Y), samarium (Sm), hafnium (Hf), zirconium (Zr), tantalum (Ta), lanthanum (La), barium (Ba), and bismuth (Bi), is usable.

Figure 5:
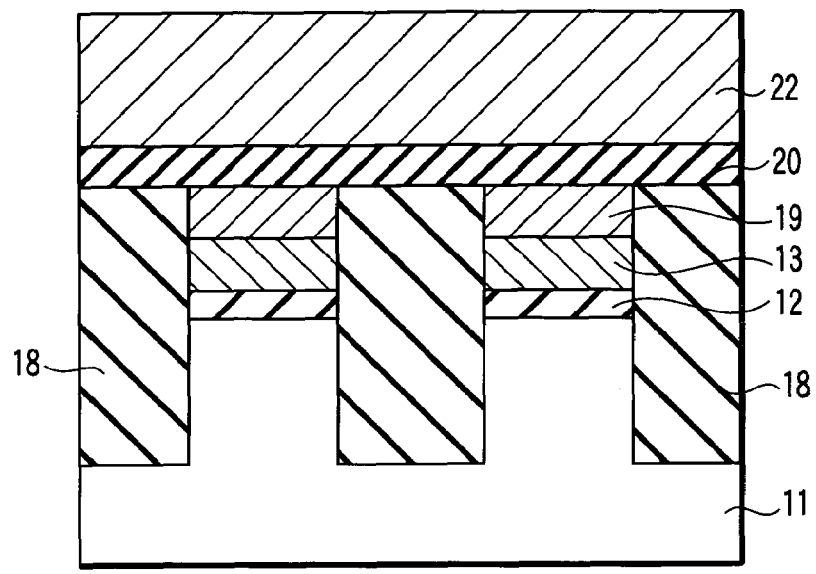

As is shown in FIG. 5, a second conductive layer 22 of, e.g. polysilicon, which becomes a control gate, is formed on the second insulation film 20 to a thickness of 10 to 200 nm. The second conductive layer 22 becomes a control electrode of the nonvolatile semiconductor memory device.

After the formation of the second conductive layer 22, the resultant structure is subjected to anneal (post-deposition anneal (PDA)) in an atmosphere containing an inert gas such as nitrogen, Ar or He, a reducing atmosphere such as hydrogen, or an oxidizing atmosphere such as oxygen radical, oxygen, ozone or water at a temperature of 500 to 1200° C. for 10 minutes to 2 hours in the case of furnace anneal or for one second to 30 minutes in the case of lamp anneal. The PDA can achieve density enhancement and quality improvement of the second insulation film 20. Further, electrical characteristics such as leak current, hysteresis and Vfb (flat band voltage) shift can be improved.

The above-described PDA process causes a reaction at an interface between the second insulation film 20 and the second conductive layer 22 and at an interface between the second insulation film 20 and the second-layered conductive layer 19. Consequently, mutual diffusion takes place between silicon in the second-layered conductive layer 19 and the second conductive layer 22 and metal ions of Al, Hf or Zr, for example, in the second insulation film 20.

Figure 6:
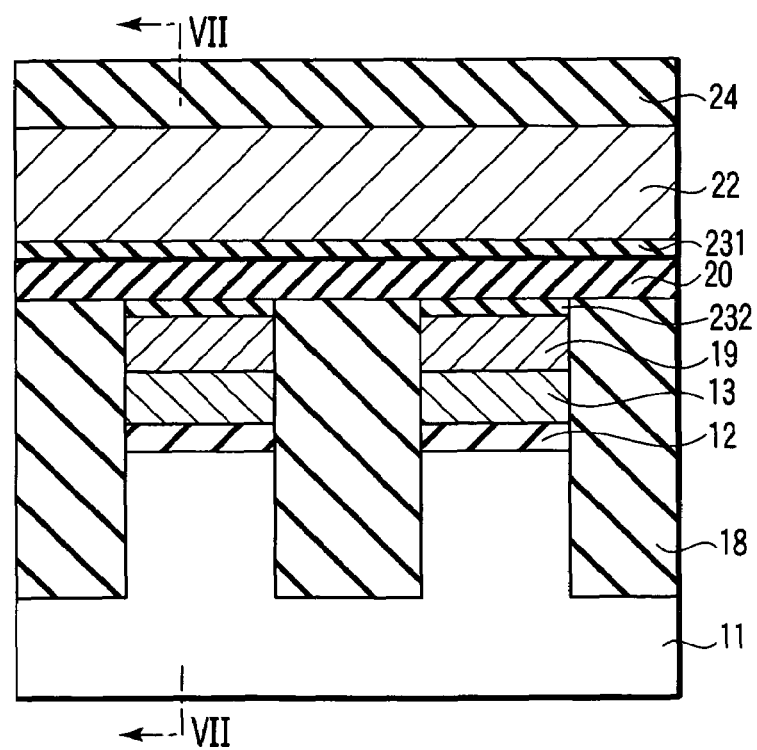

By the mutual diffusion, as shown in FIG. 6, a mutual diffusion layer 231 having a concentration gradient is formed to a thickness ranging from one atomic layer (0.1 nm) to 20 nm although the mutual diffusion is affected by the PDA conditions. That is, a silicate layer 231 which is a mixed oxide material composed of silicon and the metal ions contained in the second insulation film 20 is formed. As a result of the mutual diffusion, the adhesion between the second insulation film 20 and the second conductive layer 22 is improved, thereby preventing peeling of the film that would occur under the same PDA conditions immediately after formation of the second insulation film 20.

Similarly, a reaction occurs at an interface between the second-layered conductive layer 19 and the second insulation film 20 to form a mutual diffusion layer 232. Thereby, the adhesion between the second insulation film 20 and the second-layered conductive layer 19 is improved.

For example, when the second insulation film 20 is formed, there may be a case where an oxide film such as a silicon oxide film is formed between the second-layered conductive layer 19 and the second insulation film 20. In this case however, the metal element and the silicon element are diffused to form the mutual diffusion layer 232.

Figure 7:
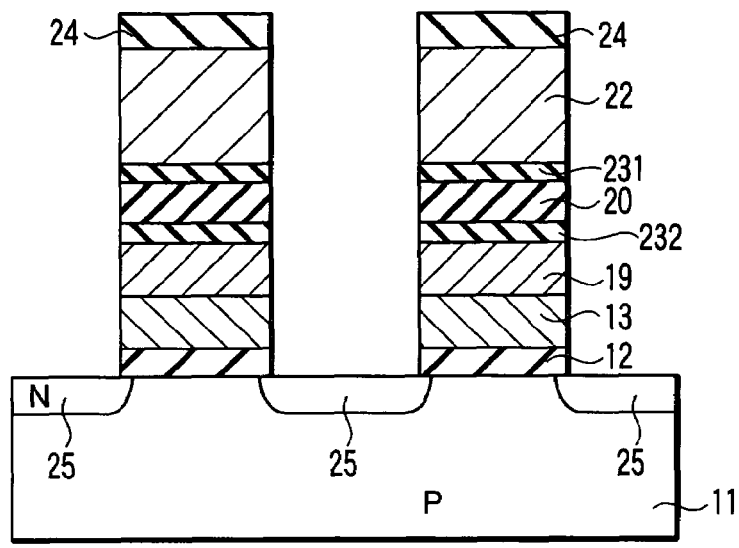
FIG. 7 is a cross-sectional view that schematically illustrates the nonvolatile semiconductor memory device according to the first embodiment.

Thereafter, a resist film 24 is formed over the second conductive layer 22 and patterned to form a resist pattern. Using the resist pattern, etching is performed down to the first insulation film 12 by an ordinary method to obtain a cross-sectional structure as shown in FIG. 7. This cross-sectional structure is viewed along line VII-VII in FIG. 6 in a direction perpendicular to the sheet surface of FIG. 6. An n-type impurity is introduced into the substrate surface that is exposed in a self-alignment fashion relative to the gate structure, and is subjected to heat treatment to provide source/drain regions 25, thereby providing each memory cell.

SECOND EMBODIMENT

Figure 8:
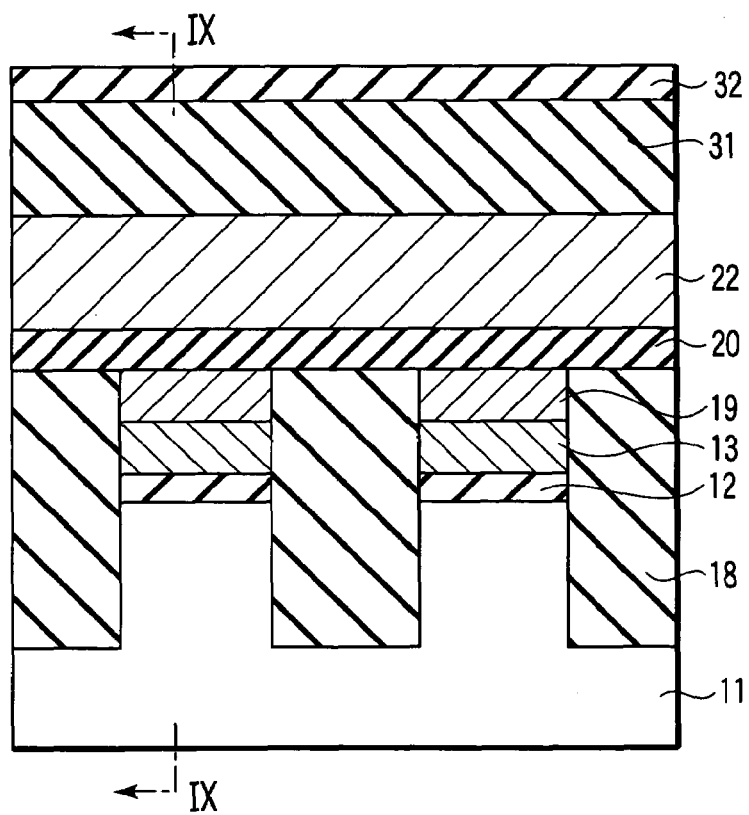

Next, a second embodiment will be described. The second embodiment is common to the first embodiment up to the fabrication step illustrated in FIG. 5 and common parts are denoted by like reference numerals. Specifically, an insulation film 31 is formed to a thickness of 10 to 500 nm on the second conductive layer 22 as shown in FIG. 8.

A resist film 32 is formed on the insulation film 31 and patterned to provide a resist pattern. Using the resist pattern, etching is performed down to the first insulation film 12 by an ordinary method to obtain a cross-sectional structure as shown in FIG. 9. This cross-sectional structure is viewed along line IX-IX in FIG. 8 in a direction perpendicular to the sheet surface of FIG. 8.

Subsequently, the resultant structure is subjected to anneal (post-deposition anneal (PDA)) in an atmosphere containing inert gas such as $N_2$, Ar or He or an atmosphere containing an oxidizer such as oxygen radical, oxygen, ozone or water at a temperature of 500 to 1200° C. for 30 minutes to 2 hours in the case of furnace anneal or for one second to 30 minutes in the case of lamp anneal. The PDA process causes a reaction at an interface between the second insulation film 20 and the second conductive layer 22 and at an interface between the second insulation film 20 and the second-layered conductive layer 19. Consequently, mutual diffusion takes place between silicon in the second conductive layer 22 and the second-layered conductive layer 19 and metal ions of Al, Hf or Zr, for example, in the second insulation film 20.

By the mutual diffusion, as shown in FIG. 10, mutual diffusion layers each having a concentration gradient are formed to a thickness of one atomic layer (0.1 nm) to 20 nm, respectively, although the mutual diffusion is affected by the PDA conditions. That is, silicate layers 331 and 332 which are a mixed oxide material composed of silicon and the metal ions contained in the second insulation film 20 are formed. Thereafter, an n-type impurity is introduced into the substrate surface that is exposed in a self-alignment fashion relative to the gate structure. The impurity-doped surface is subjected to heat treatment to provide source/drain regions 25. Each memory cell is thus provided.

As a result of the mutual diffusion, the adhesion between the second insulation film 20 and the second conductive layer 22 and between the second-layered conductive layer 19 and the second insulation film 20 will be improved, thereby preventing peeling of the film that would occur under the same PDA conditions immediately after formation of the second insulation film 20. For example, when the second insulation film 20 is formed, there may be a case where an oxide film such as a silicon oxide film is formed between the second-layered conductive layer 19 and the second insulation film 20. However, the metal element and the silicon element are diffused to form the mutual diffusion layer 232.

In this embodiment, PDA is performed after the etching process. Thus, at the time of etching, no grain boundary forms due to crystallization or densification of the film during the PDA. The selectivity ratio relative to the underlying second-layered conductive layer 19 can easily be increased, and a uniform etching process can be performed. Moreover, by adding an oxidizing agent to the PDA anneal atmosphere after the etching process, the oxygen will be fed into the second insulation film 20 to compensate oxygen defect.

Since the PDA is performed after the etching process, side walls of the first conductive layer 13, the second-layered conductive layer 19 and the second conductive layer 22 are oxidized as shown in FIG. 10. As a result, silicon oxide films 34 having a large thickness at end portions and a small thickness at central portions are formed, and a device with higher reliability is obtained.

THIRD EMBODIMENT

Next, a third embodiment will be described. The third embodiment is common to the first embodiment up to the fabrication step illustrated in FIG. 3 and common parts are denoted by like reference numerals. That is, the second-layered conductive layer 19 of polysilicon, which becomes a part of the first conductive layer 13, is deposited, and is then planarized by CMP with use of the buried insulation film 18 as a stopper.

Figure 11:
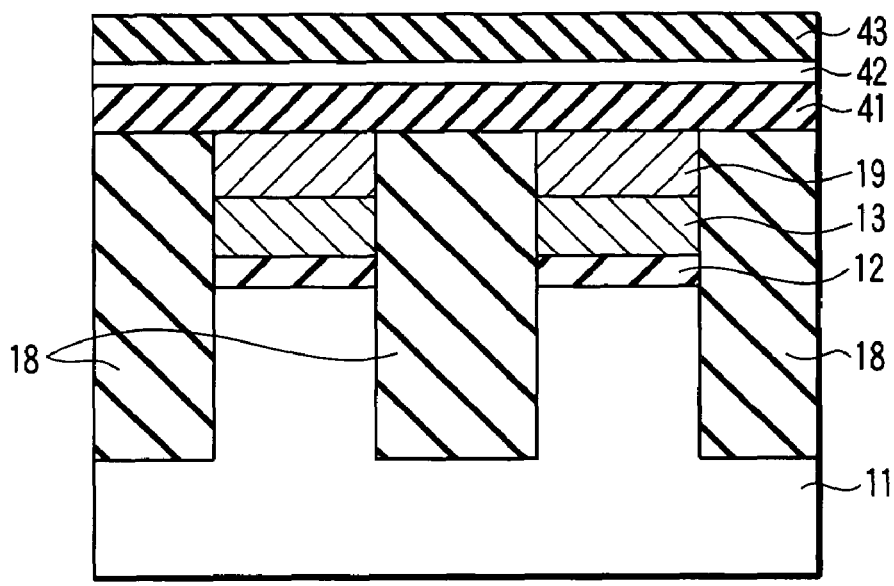
FIGS. 11 and 12 are cross-sectional views each of which schematically illustrates a part of a fabrication process of a nonvolatile semiconductor memory device according to a third embodiment.

Thereafter, as shown in FIG. 11, a second insulation film 41, which has a higher dielectric constant than a silicon oxide film, is formed on the planarized surface to a thickness of 1 to 60 nm. A Si layer 42 is formed to a thickness of 0.1 to 3 nm on the second insulation film 41. At this time, the formation temperature of the Si layer 42 ranges from 200 to 1000° C. The crystallization may be amorphous or polycrystal. Next, a third insulation film 43, which has a higher dielectric constant than a silicon oxide film, is formed on the Si layer 42 to a thickness of 1 to 60 nm.

It is desirable that the high dielectric constant film used as the second and third insulation films is a film having a dielectric constant that is higher than a specific dielectric constant of 3.8 to 4 of a silicon oxide film ($SiO_2$ film) and, in particular, higher than a specific dielectric constant of about 5 to 5.5 obtained with conventional ONO films.

A single-layer film, or a film stack of a plurality of films, which are selectable from the following examples, may be used: a strontium oxide (SrO) film with a specific dielectric constant of about 6; a silicon nitride ($Si_3N_4$) film with a specific dielectric constant of about 7; an aluminum oxide ($Al_2O_3$) film with a specific dielectric constant of about 8; a magnesium oxide (MgO) film with a specific dielectric constant of about 10; a scandium oxide ($Sc_2O_3$) film or a gadolinium oxide ($Gd_2O_3$) film with a specific dielectric constant of about 14; a yttrium oxide ($Y_2O_3$) film or a samarium oxide ($Sm_2O_3$) film with a specific dielectric constant of about 16; a hafnium oxide ($HfO_2$) film or a zirconium oxide ($ZrO_2$) film with a specific dielectric constant of about 22; a tantalum oxide ($Ta_2O_5$) film with a specific dielectric constant of about 25; a barium oxide (BaO) film with a specific dielectric constant of about 35; and a bismuth oxide ($Bi_2O_3$) film with a specific dielectric constant of about 40.

Furthermore, a composite film composed of the above films and a silicon oxide film is usable. The composite film may be a film stack of three or more layers. It is desirable, however, that the specific dielectric constant of the entire film is greater than about 5 to 5.5. Alternatively, an insulation film of a ternary compound such as hafnium aluminate (HfAlO) film may be used. Specifically, an oxide or a nitride, which includes at least one of strontium (Sr), aluminum (Al), magnesium (Mg), scandium (Sc), gadolinium (Gd), yttrium (Y), samarium (Sm), hafnium (Hf), zirconium (Zr), tantalum (Ta), lanthanum (La), barium (Ba), and bismuth (Bi), is usable. Even when any combination of insulation films which have higher dielectric constant than the $SiO_2$ is used for the second insulation film and the third insulation film, similar advantages can be achieved.

Figure 12:
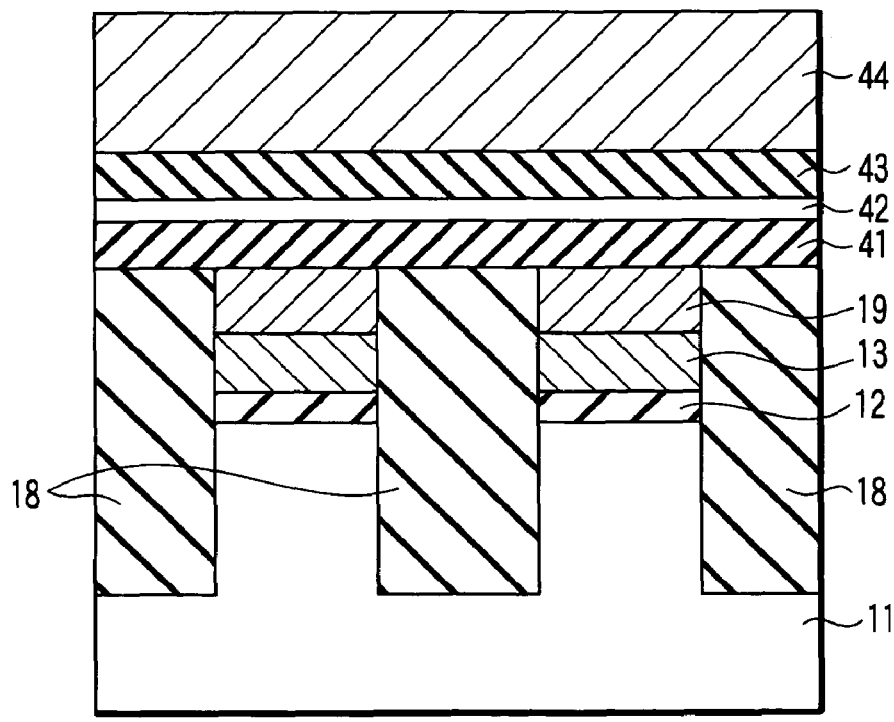

As is shown in FIG. 12, a second conductive layer 44 is formed on the third insulation film 43 to a thickness of 10 to 200 nm. The second conductive layer 44 is composed of a material containing Si. The second conductive layer 44 becomes a control electrode in the nonvolatile semiconductor memory device.

After formation of the second conductive layer 44, the resultant structure is subjected to anneal (post-deposition anneal (PDA)) at a temperature of 500 to 1200° C. The PDA process can achieve density enhancement of the second insulation film 41 and the third insulation film 43. Further, the above-described PDA process causes a reaction at an interface between the second insulation film 41 and the Si layer 42 and at an interface between the third insulation film 43 and the second conductive layer 44.

By the reaction at the interfaces, Si is diffused into the second insulation film 41 and the third insulation film 43 from the Si layer 42 and the second conductive layer 44, respectively. Furthermore, the metal element contained in the second insulation film 41 is diffused into the Si layer 42 and the metal element contained in the third insulation film 43 is diffused into the Si layer 42 and the second conductive layer 44.

Figure 13:
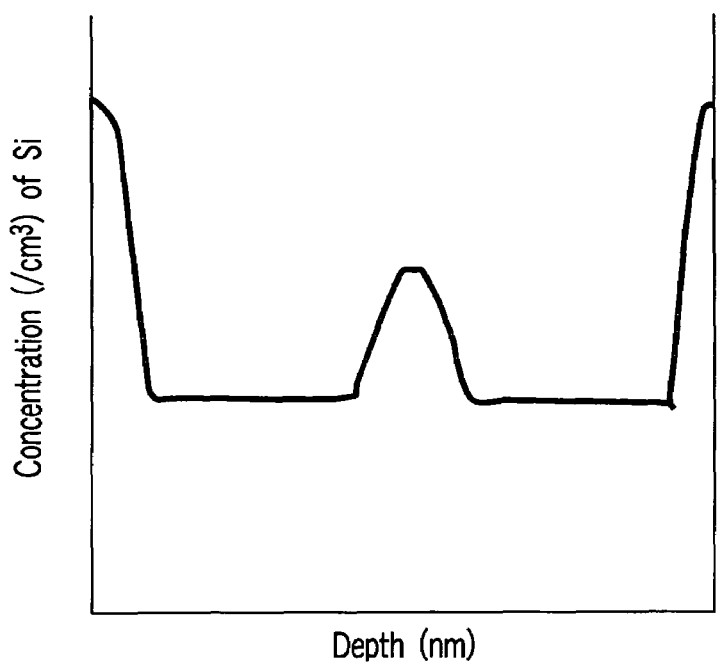
FIG. 13 is a diagram that illustrates a relationship between depth (nm) and Si concentration ($cm^{-3}$) in alumina film.

FIG. 13 shows a relationship between a depth (nm) and a Si concentration ($cm^{-3}$) in an insulation film described later, where the Si concentration is high at the surface and the bottom and is lower at the central portion of the film than at the surface.

Figure 14:
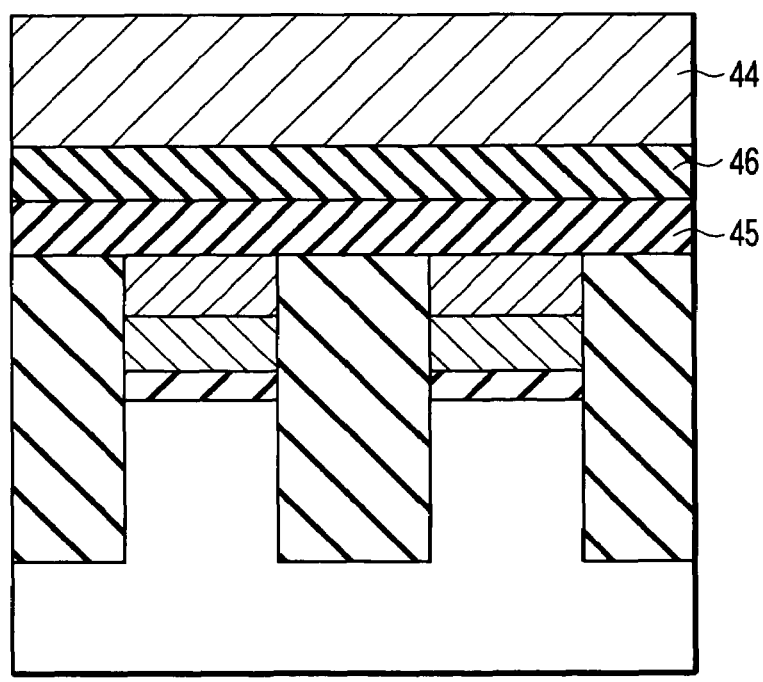
FIGS. 14 and 15 are cross-sectional views each of which schematically illustrates a part of a fabrication process of the nonvolatile semiconductor memory device according to the third embodiment.

As a result of the diffusion of Si, the Si layer 42 disappears, and the second insulation film 41 and the third insulation film 43 become a second insulation film 45 containing Si and a third insulation film 46 containing Si, respectively, to provide a structure shown in FIG. 14. FIG. 13 shows one example of Si concentration distribution in the insulation film. The Si concentration in the insulation film has peaks near the disappeared Si layer 42 and the boundary between the upper and lower electrodes. In the Si concentration distribution shown in FIG. 13, the Si concentration at the peak corresponds to about 10 atomic % and several atomic % in the insulation film.

Thus, Si is contained in the second and third insulation films, thereby decreasing the leak current. This reason is considered as that the defect density in the insulation film (density at a portion where the insulation film network bond is imperfect) can be reduced.

The Si concentration in the insulation film is not limited to the above values. The advantage is achieved at 0.1 atomic % or more. There may be a case where the insulation film network bond is imperfect when the Si concentration is too high, and thus 1 to 10 atomic % is desirable. Furthermore, in this embodiment, there is shown a case where the Si layer completely disappears in PDA, but the Si layer is not limited thereto. Even when the Si layer remains, there is a leak reduction effect. But, there is a larger leak reduction effect when the Si layer completely disappears.

Figure 15:
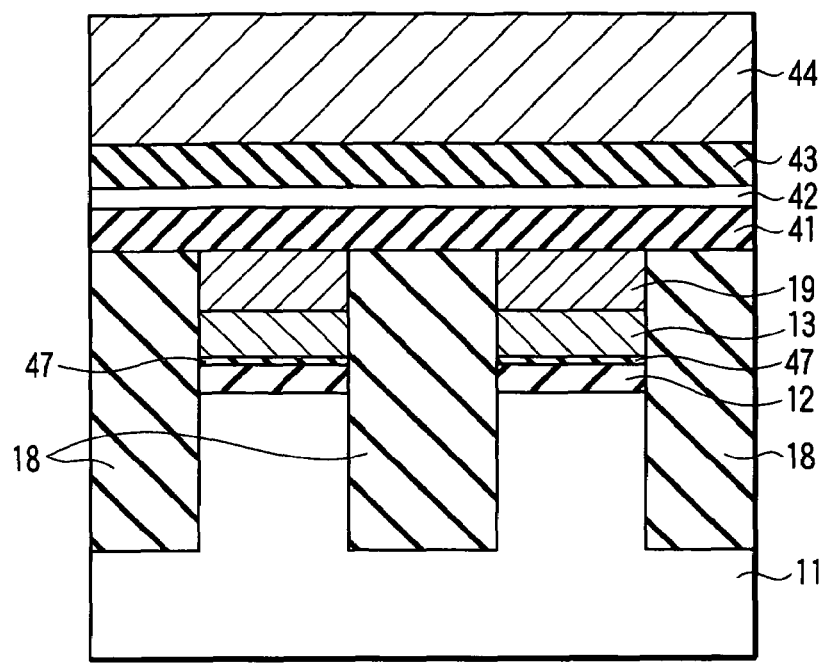

There may be a case where a metal element contained in the second insulation film 41 is diffused into the second-layered conductive layer 19 and the first conductive layer 13 and reaches the first insulation film 12 to cause the deterioration in reliability of the device. In this case, as shown in FIG. 15, it is effective to form an insulation film (diffusion barrier film) 47 for inhibiting the diffusion between the second insulation film 41 and the second-layered conductive layer 19, between the second-layered conductive layer 19 and the first conductive layer 13, or between the first conductive layer 13 and the first insulation film 12.

It is desirable that the diffusion barrier film is an insulation film such as a silicon nitride film which has a higher dielectric constant than $SiO_2$, an insulation film such as a metal nitride film, or a conductive film such as a metal nitride. The effectiveness of the present invention can be achieved by forming a diffusion barrier film suitable as the diffusion barrier film. Even when the metal element in the third insulation film 43 is diffused into the second conductive layer 44 to cause a problem, it is effective to form a similar diffusion barrier film between the third insulation film 43 and the second conductive layer 44.

As a result of the density enhancement by the above-described PDA process, an increase in dielectric constant and a decrease in leak current are enabled. As shown in this embodiment, the Si layer 42 is inserted between the second and third insulation films, thereby increasing the diffusion amount of Si into these insulation films. Although this embodiment shows the example where one Si layer 42 is formed between the second insulation film 41 and the third insulation film 43, one or more Si layers to be inserted between the insulation films can achieve the similar advantage in the permitted range on the device. For example, the Si layers are inserted near the upper and lower interfaces of the inter-electrode insulation films and the above-described PDA process is performed, thereby forming Si high-concentration layers near the upper and lower interfaces of the inter-electrode insulation films.

When such Si concentration distribution is formed, it is possible to effectively perform a leak reduction on writing operation in the device and a leak reduction on erasing operation. At the same time, since the Si concentration is low at the central portion in the insulation film, it is desirable that a decrease in the dielectric constant of the inter-electrode insulation film by adding Si can be restricted to a minimum. A defect in the film can be reduced by adding Si in the insulation film, thereby reducing a leak current. It is possible to improve tolerance to an electric stress on the device operation or to a change in use circumstances by reducing a defect in the insulation film, thereby largely improving the reliability of the device.

FOURTH EMBODIMENT

A fourth embodiment will be described. The fourth embodiment is common to the first embodiment up to the fabrication step illustrated in FIG. 2 and common parts are denoted by like reference numerals. That is, the first insulation film (tunneling insulation film) 12 and the first conductive layer 13 made of phosphorus doped-polysilicon, that is a floating gate electrode are formed on the silicon substrate 11, and the insulation film 18 such as a silicon oxide film is buried in the isolation trenches 17 and is planarized.

Figure 16:
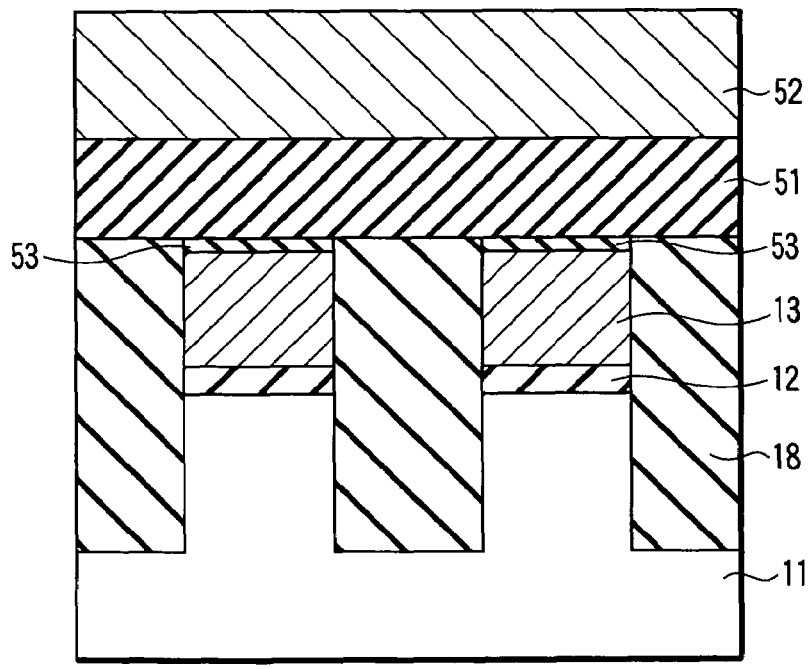
FIGS. 16 and 17 are cross-sectional views each of which schematically illustrates a part of a fabrication process of a nonvolatile semiconductor memory device according to a fourth embodiment.

Thereafter, as shown in FIG. 16, an inter-electrode insulation film 51 made of an alumina film with a thickness of about 20 nm and a control gate electrode 52 made of phosphorus doped-polysilicon are stacked on the planarized substrate. When this alumina film 51 is formed, the surface of the phosphorus doped-polysilicon film is oxidized and an interface oxide layer 53 with a thickness of about 2 nm is formed.

Figure 17:
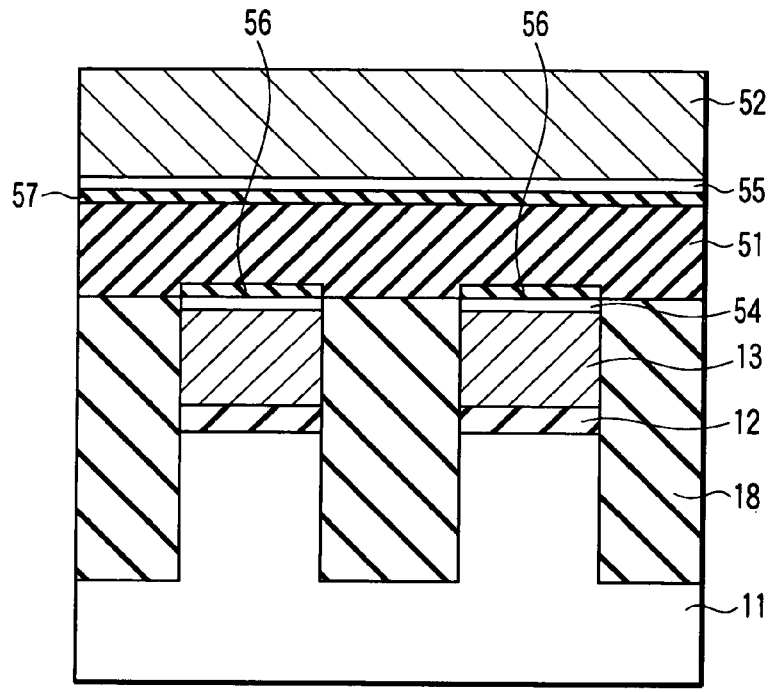

Next, anneal (PDA) is performed at an atmosphere containing a non-oxidizer such as nitrogen gas at a temperature of about 1000° C. for about 1 minute. As a result, as shown in FIG. 17, the interface oxide layer 53 disappears. The aluminum element in the alumina film 51 is diffused into the floating gate electrode 13 and the control gate electrode 52, and the aluminum-added phosphorus doped-polysilicon conductive layers 54 and 55 with a thickness of about 3 nm are formed on an upper layer of the floating gate electrode and on a lower layer of the control gate electrode, respectively. Also in this case, the silicon is diffused into the insulation film 51 to form silicate layers 56 and 57, which are mutual diffusion layers, respectively.

As in this embodiment, the PDA is performed with a cap layer such as a polysilicon layer, thereby restricting an increase in the film thickness of the interface oxide layer due to the diffusion of the remaining oxygen in the PDA atmosphere. Furthermore, the existing interface oxide layer disappears (or the film thickness decreases) and an increase in the electric capacity in the inter-electrode insulation film and a decrease in the leak current can be achieved.

Figure 18:
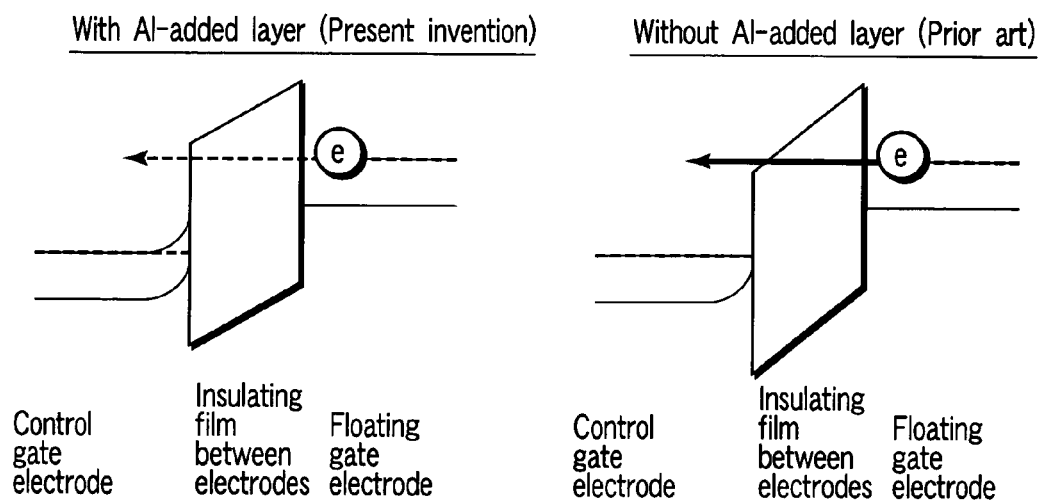
FIG. 18 is a band diagram of a structure of control gate electrode/inter-electrode insulation film/floating gate electrode according to the invention and the prior art.

As described above, although the aluminum-added phosphorus doped-polysilicon conductive layers 54 and 55 are formed at the interfaces between the inter-electrode insulation film 51 and the upper and lower electrodes 13 and 52, a depletion layer is easily formed in such conductive layers. Thus, as shown in a band diagram in FIG. 18, when an electric field is applied, an electric field of the inter-electrode insulation film is relaxed. Therefore, there can be obtained effects such as inhibition of charge for passing through an inter-electrode insulation film due to self electric field of write cell, inhibition of charge injection due to self electric field of erase cell, and leak reduction on reading or writing operation, thereby improving charge-holding characteristics of the nonvolatile semiconductor memory device. When the added amount of aluminum elements is more, the electric field relaxing effect is more conspicuous. However, the amount is desirably lower than the dopant element concentration in the electrodes.

In the above-described embodiment, an alumina film is used as the inter-electrode insulation film and the phosphorus doped-polysilicon layer is used as the upper and lower electrodes, but other material is also usable, The inter-electrode insulation film is not limited to an insulation film including aluminum, and may be an insulation film containing ternary element such as boron, gallium or indium. The upper and lower electrodes are not limited to the phosphorus doped-polysilicon layer, and any n-type semiconductor electrode is usable. Furthermore, any combination of an insulation film containing group V element and a p-type semiconductor electrode is also usable.

In the above-described embodiment, the aluminum-added phosphorus doped-polysilicon conductive layer with a thickness of about 3 nm is produced, but the thickness is not limited to the above. It is desirable that the electric capacity of the inter-electrode insulation film is sufficiently large. Therefore, it is preferable that the temperature and the time of the PDA process is set to a minimum. Further, the element to be added to the inter-electrode insulation film is desirably a heavy element such as aluminum, gallium or indium having a small diffusion coefficient. Moreover, when the control gate electrode 52 made of phosphorus doped-polysilicon is formed, Al may be introduced to form the control gate electrode 52 made of Al-added polysilicon.

Also in this embodiment, there may be a case where an element in the inter-electrode insulation film at the time of PDA is diffused down to the tunneling insulation film to cause a deterioration in reliability of the device. At this time, it is effective to form an insulation film (diffusion barrier film) for restricting the diffusion between the inter-electrode insulation film and the floating gate electrode, at the intermediate area of the floating gate electrode, or between the floating gate electrode and the tunneling insulation film. It is desirable that the diffusion barrier film is an insulation film such as a silicon nitride film, which has a higher dielectric constant than a silicon oxide film, or a conductive film such as a metal nitride. A suitable diffusion barrier film is formed, thereby achieving the effectiveness of the present invention while avoiding the deterioration in the characteristics of the tunneling insulation film. Additionally, even when the element in the inter-electrode insulation film is diffused into the control gate electrode to cause a problem, it is effective that a similar diffusion barrier film is formed between the inter-electrode insulation film and the control gate electrode.

FIFTH EMBODIMENT

Next, a fifth embodiment will be descried. The fifth embodiment is common to the first embodiment up to the fabrication step illustrated in FIG. 3 and common parts are denoted by like reference numerals. That is, the second-layered conductive layer 19 of polysilicon, which becomes a part of the first conductive layer 13, is deposited, and is then planarized by CMP with use of the buried insulation film 18 as a stopper.

Figure 19:
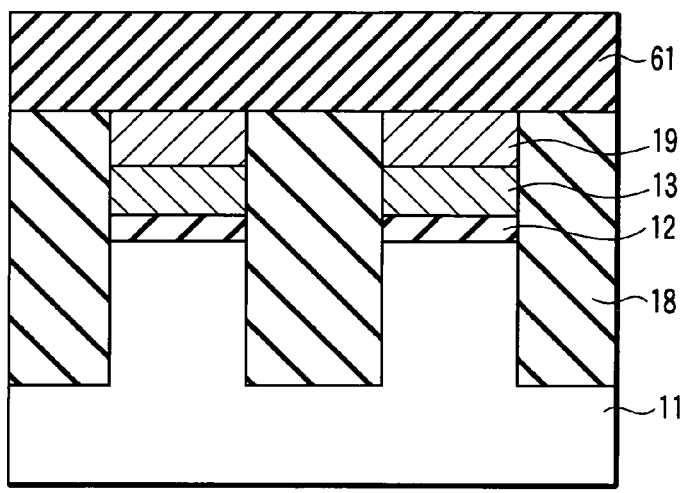

Thereafter, as shown in FIG. 19, an alumina film 61 as a second insulation film, which has a higher dielectric constant than a silicon oxide film, is formed on the planarized surface to a thickness of 1 to 120 nm. The alumina film 61 is formed at a film forming temperature of 600° C. or less and is a low-density film with a carbon concentration of $5 \times 10^{19}$ cm$^{-3}$ or more. When the film forming is performed at a low temperature of 600° C. or less, many bonds(or bonded radicals) containing carbon exist in the film. The bonds prevent absorption of Al source on the surface resulting in an insulation film having small density.

Figure 20:
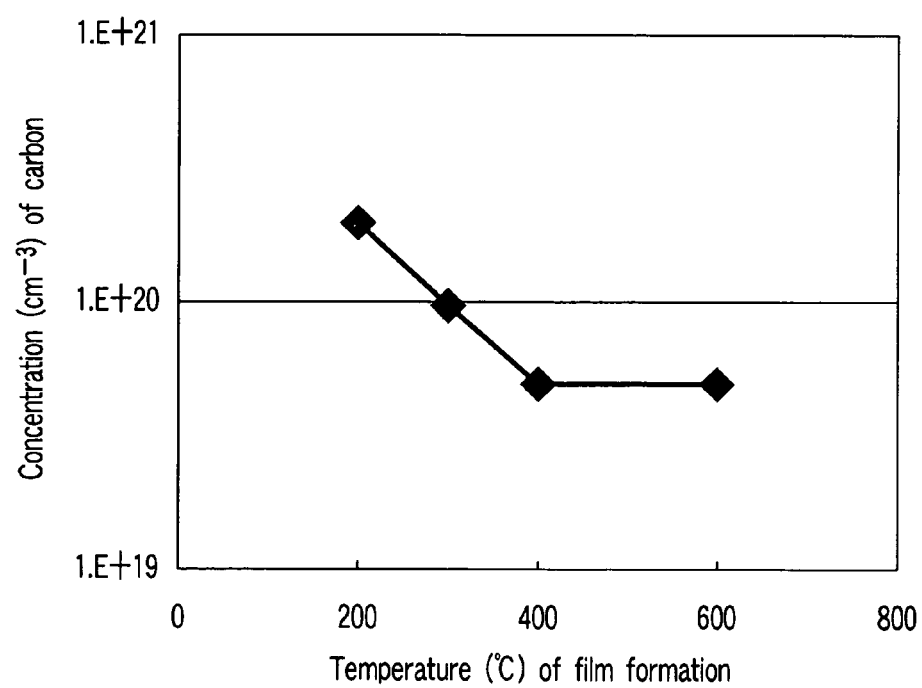

FIG. 20 shows a relationship between a film forming temperature (° C.) and a carbon concentration (cm$^{-3}$) in the alumina film 61. The film forming is performed at a temperature of 600° C. or less with use of the Al source containing carbon, thereby increasing the carbon concentration in the insulation film to facilitate the process of the insulation film 61.

A material for forming the alumina film 61 may use any Al source gas containing carbon such as trimethyl aluminum (TMA), triethyl aluminum (TEA), Al(R)3 (R is a group made of carbon and hydrogen), Al(OR)3, AlH3:NR or Al(R)x(OR)y(NR)z(x+y+z=3). Furthermore, the oxidizer may use any gas containing oxygen such as $O_3$, $O_2$, $H_2O$, or NO.

This embodiment have described, in particular, the alumina film. It is desirable that the high dielectric constant film used as the second insulation film 61 is a film having a dielectric constant that is higher than a specific dielectric constant of 3.8 to 4 of a silicon oxide film (SiO$_2$ film) and, in particular, higher than a specific dielectric constant of about 5 to 5.5 obtained with conventional ONO films. A single-layer film, or a film stack of a plurality of films, which are selectable from the following examples, may be used as the second insulation film 61: a strontium oxide (SrO) film with a specific dielectric constant of about 6; a silicon nitride (Si$_3$N$_4$) film with a specific dielectric constant of about 7; an aluminum oxide (Al$_2$O$_3$) film with a specific dielectric constant of about 8; a magnesium oxide (MgO) film with a specific dielectric constant of about 10; a scandium oxide (Sc$_2$O$_3$) film or a gadolinium oxide (Gd$_2$O$_3$) film with a specific dielectric constant of about 14; a yttrium oxide (Y$_2$O$_3$) film or a samarium oxide (Sm$_2$O$_3$) film with a specific dielectric constant of about 16; a hafnium oxide (HfO$_2$) film or a zirconium oxide (ZrO$_2$) film with a specific dielectric constant of about 22; a tantalum oxide (Ta$_2$O$_5$) film or a lanthanum oxide (La$_2$O$_3$) film with a specific dielectric constant of about 25; a barium oxide (BaO) film with a specific dielectric constant of about 35; and a bismuth oxide (Bi$_2$O$_3$) film with a specific dielectric constant of about 40. Furthermore, a composite film of the films and a silicon oxide film is usable. The composite film may be a film having three layers or more. It is desirable that the specific dielectric constant of the entire film is larger than about 5 to 5.5. Alternatively, an insulation film of a ternary compound such as hafnium aluminate (HfAlO) film may be used. Specifically, an oxide or a nitride, which includes at least one of strontium (Sr), aluminum (Al), magnesium (Mg), scandium (Sc), gadolinium (Gd), yttrium (Y), samarium (Sm), hafnium (Hf), zirconium (Zr), tantalum (Ta), lanthanum (La), barium (Ba), and bismuth (Bi), is usable. Any combination of insulation films with higher dielectric constant than the SiO$_2$ as the second insulation film can achieve similar advantage.

As is shown in FIG. 21, a second conductive layer 62 is formed on the second insulation film 61 to a thickness of 10 to 20 nm. The second conductive layer 62 is formed with use of a material containing Si. The second conductive layer 62 becomes a control electrode in the nonvolatile semiconductor memory device.

As is shown in FIG. 22 which is the cross-sectional view taken along line XXII-XXII in FIG. 21, a third insulation film 63 is formed on the second conductive layer 62 to a thickness of 10 to 500 nm. A resist film is applied on the third insulation film 63 and patterned to form a resist pattern 64, and is etched down to the first insulation film 12 by an ordinary method. At this time, when many bonds containing carbon exist in the second insulation film 61, the bond of the film itself becomes weak, thereby easily performing the etching.

Thereafter, anneal (post-deposition anneal (PDA)) is performed at a temperature of 100° C. to 1200° C. Density enhancement of the second insulation film 61 is achieved by this PDA process. At the same time, this PDA process causes a reaction at an interface 65 between the second insulation film 61 and the second-layered conductive layer 19 and at an interface 66 between the second insulation film 61 and the second conductive layer 62. Si is diffused into the second insulation film 61 from the second-layered conductive layer 19 and the second conductive layer 62 with the reaction at these interfaces. As a result, the second insulation film 61 with low density can contain more Si.

According to this embodiment, the film forming is performed at a temperature of 600° C. or less with use of Al source containing carbon, thereby increasing a carbon concentration in the insulation film to facilitate the process of the insulation film 61. The diffusion amount of Si is correlated with the density of the insulation film. The smaller the density is, the more Si is taken into the insulation film. The density of the insulation film containing much carbon is decreased and the insulation film 61 includes much Si after the PDA process, thereby decreasing the leak current.

Next, a NAND-type flash memory using the above-described nonvolatile semiconductor memory device, that is, the nonvolatile memory cell, will be described.

Figure 23:
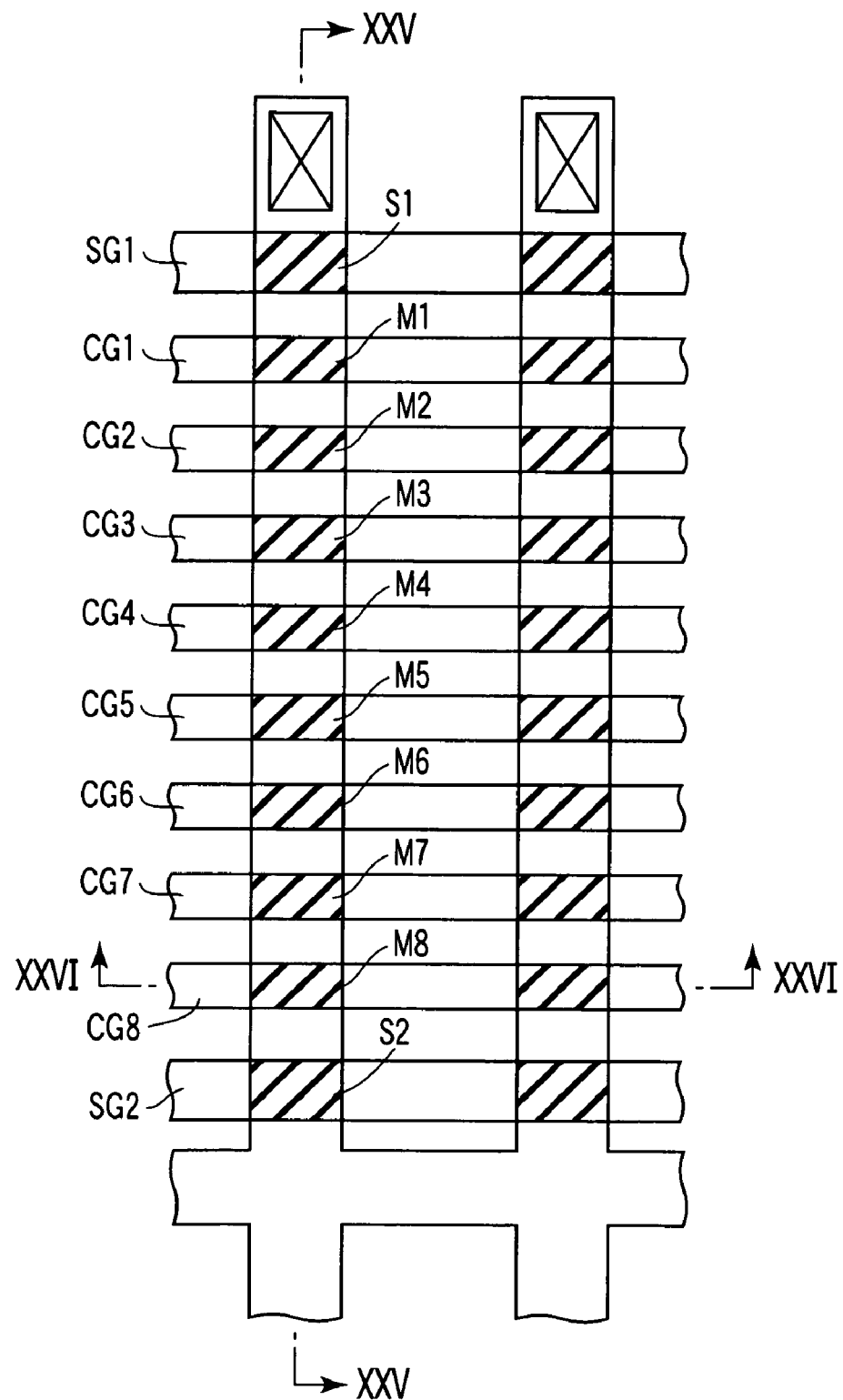
FIG. 23 is a plan view that shows a structure of a NAND-type flash memory.
Figure 24:
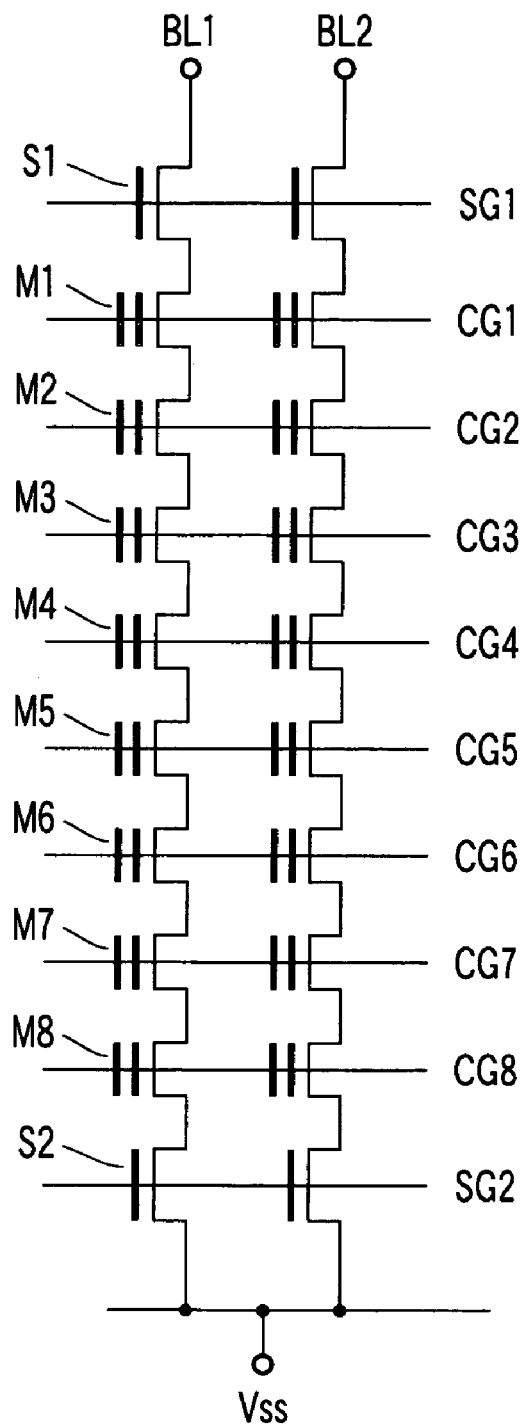
FIG. 24 is an equivalent circuit of the NAND-type flash memory.
Figure 25:
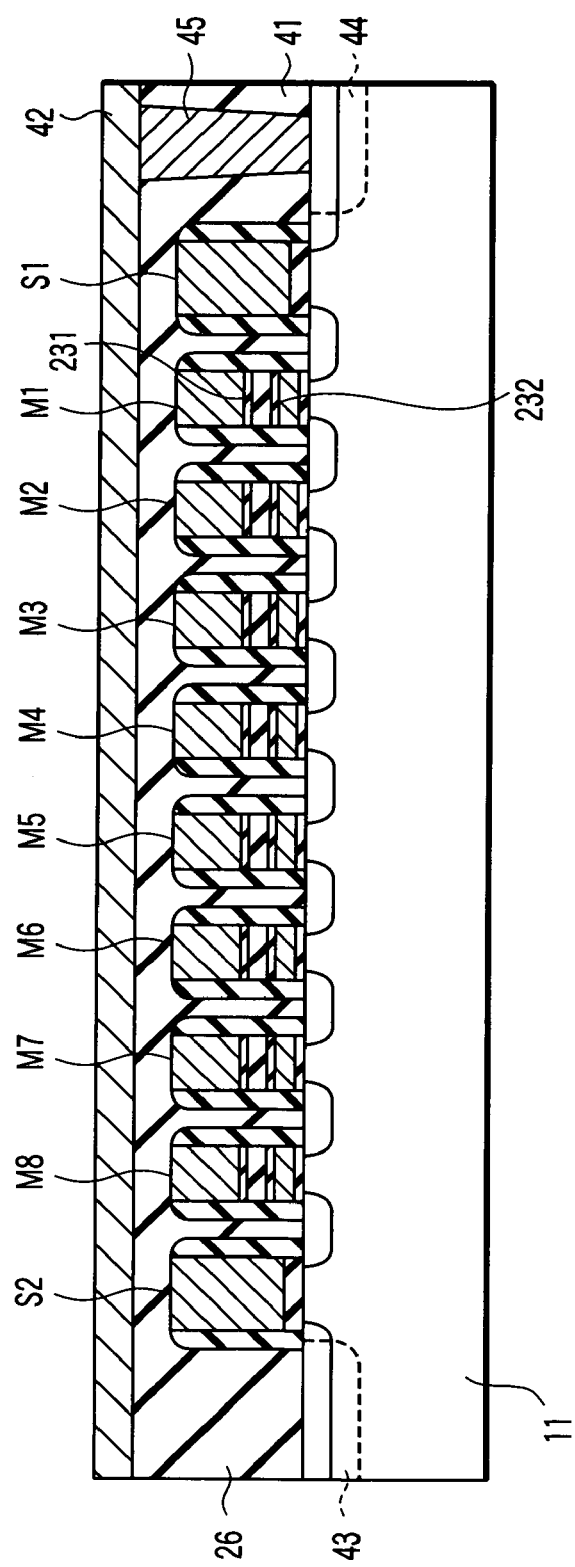
FIG. 25 is a cross-sectional view taken along line XXV-XXV in FIG. 23.

FIG. 23 is a plan view showing the structure of the NAND-type flash memory (depiction of bit lines is omitted), and FIG. 24 shows an equivalent circuit thereof. FIG. 25 is a cross-sectional view taken along line XXV-XXV in FIG. 23, and FIG. 26 is a cross-sectional view taken along line XXVI-XXVI in FIG. 23.

As is shown in FIGS. 23 and 24, each NAND cell unit includes series-connected memory cells M1 to M8, and select transistors S1 and S2 that are arranged at both ends of the memory cells.

Select gate lines SG1 and SG2 are connected to the select transistors S1 and S2, and control gate lines (word lines) CG1 to CG8 are connected to the memory cells M1 to M8. A bit line (BL1, BL2) is connected to each select transistor S1. Here, eight memory cells are shown, but the number of memory cells is not limited to eight. For example, 16 or 32 memory cells may be employed.

Figure 26:
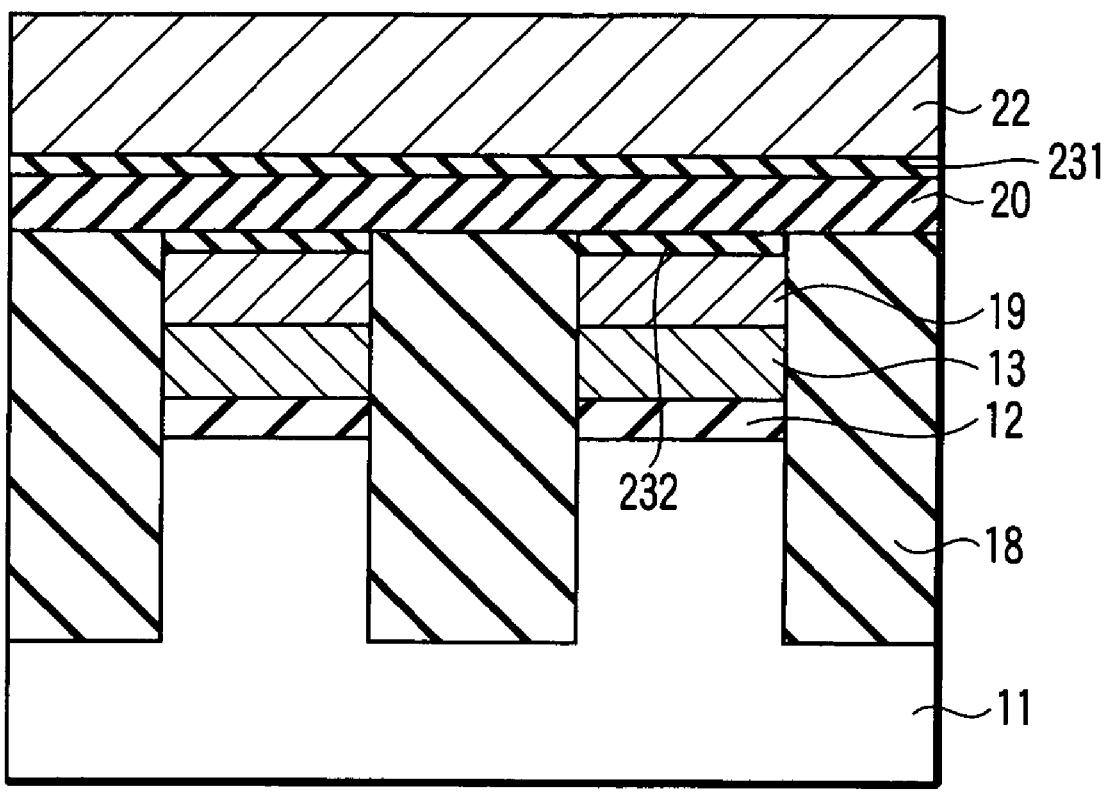
FIG. 26 is a cross-sectional view taken along line XXVI-XXVI in FIG. 23.

As is shown in FIGS. 25 and 26, the memory cells M1 to M8 and select transistors S1 and S2 are formed in the p-type silicon substrate 11. In the figure, each of the memory cells M1 to M8 has the same structure as in the first embodiment, so common parts are denoted by like reference numerals.

Specifically, each of the memory cells M1 to M8 has a gate structure that comprises a first insulation film (tunneling insulation film) 12 formed on the silicon substrate 11; a floating gate that is provided on the first insulation film 12 and includes the first-layered conductive layer 13 and the second-layered conductive layer 19, which are formed of polysilicon; a first mutual diffusion layer 232 formed on the floating gate; the second insulation film (inter-electrode insulation film) 20 that is provided on the first mutual diffusion layer 232 and has a higher dielectric constant than a silicon oxide film; a second mutual diffusion layer 231 formed on the second insulation film 20; and a control gate that is provided on the second mutual diffusion layer 231, and is formed of the second conductive layer 22 of polysilicon.

Adjacent NAND cell units are isolated by an isolation film 18. A word line (not shown) is formed on the control gate 22, as is known to skilled persons.

The memory cells and select transistors are covered with an interlayer insulation film 41, and a bit line 42 is formed on the interlayer insulation film 41. High impurity concentration source/drain regions 43 and 44 are formed in the silicon substrate 11. The bit line 42 is connected to the high impurity concentration region 44 via a contact plug 45.

In the above-described embodiments, the first conductive layer comprises two layers, but the first conductive layer is not limited to this structure. In addition, the nonvolatile semiconductor memory device is applicable not only to the NAND type but also to a NOR type.

As is clear from the above-described embodiments, the high dielectric constant film is modified without non-uniformity in shape at the etching process, and thus it is possible to obtain a next-generation nonvolatile semiconductor memory device with high reliability and without unwanted peeling of film or roughness of the substrate and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a semiconductor substrate;
an isolation insulation film filled in a plurality of trenches formed in the semiconductor substrate to define a plurality of element formation regions;
a floating gate provided on each of the element formation regions through a first insulation film;
a control gate provided on the floating gate through a second insulation film containing a metal element; and
source/drain regions provided in the semiconductor substrate,
wherein a mutual diffusion layer is provided at least at an interface between the second insulation film and the control gate, and
wherein the mutual diffusion layer comprises a silicate layer of a mixed oxide material composed of a silicon element contained in the control gate and the metal element contained in the second insulation film.

2. The semiconductor memory device according to claim 1, wherein the silicate layer has a thickness of 0.1 to 20 nm.

3. The semiconductor memory device according to claim 1, wherein the mutual diffusion layer has a concentration gradient.

4. A semiconductor memory device comprising:
a semiconductor substrate;
an isolation insulation film filled in a plurality of trenches formed in the semiconductor substrate to define a plurality of element formation regions;

a floating gate provided on each of the element formation regions through a first insulation film;

a control gate provided on the floating gate through a second insulation film; and source/drain regions provided in the semiconductor substrate, wherein the second insulation film has a high dielectric constant and contains silicon, and a peak of a silicon concentration exists at least in the central portion in the second insulation film, and the second insulating film contains a metal element, and a silicate layer is formed in a boundary between the second insulating film and the control gate.

5. The semiconductor memory device according to claim 4, wherein a diffusion barrier film is provided at least between the first insulation film and the floating gate.

6. A semiconductor memory device comprising:

a semiconductor substrate;

an isolation insulation film filled in a plurality of trenches formed in the semiconductor substrate to define a plurality of element formation regions;

a floating gate provided on each of the element formation regions through a first insulation film;

a second insulation film provided on the floating gate, the second insulation film having a high dielectric constant and containing carbon;

a control gate provided on the second insulation film; and source/drain regions provided in the semiconductor substrates wherein the floating gate and the control gate contain a silicon element and the second insulating gate contains the silicon element diffused from the floating gate and the control gate.

7. A NAND-type flash memory including a plurality of NAND cell units each having a plurality of series-connected memory cells and select transistors arranged at both ends of the memory cells, each of the memory cells comprising:

a plurality of isolation insulation films filled in a plurality of trenches formed in a semiconductor substrate to define a plurality of element formation regions;

a floating gate provided on each of the element formation regions through a first gate insulation film;

a control gate provided on the floating gate through a second gate insulation film containing a metal element;

a mutual diffusion layer provided at an interface between the second gate insulation film and the control gate; and source/drain regions provided in the semiconductor substrate, and wherein the mutual diffusion layer comprises a silicate layer which is a mixed oxide material composed of a silicon element contained in the control gate and the metal element contained in the second gate insulation film.

8. The NAND-type flash memory according to claim 7, wherein the second gate insulation film comprises a high dielectric constant film.

* * * * *